United States Patent [19]

Lennox et al.

[11] 4,288,876
[45] Sep. 8, 1981

[54] DEMODULATOR FOR FREQUENCY MODULATED SIGNALS

[75] Inventors: William M. Lennox, Rockville; Hank S. Lin, Silver Spring, both of Md.

[73] Assignee: Microdyne Corporation

[21] Appl. No.: 782,202

[22] Filed: Mar. 28, 1977

[51] Int. Cl.³ .............................................. H04B 1/26
[52] U.S. Cl. .................................. 455/214; 455/337; 219/116; 219/145.1
[58] Field of Search ............... 325/349, 350, 425, 427, 325/487; 329/137, 138, 145, 50, 110, 112; 455/214, 215, 205, 210, 254, 266, 323, 336, 337, 334

[56] References Cited

U.S. PATENT DOCUMENTS

| | | | |
|---|---|---|---|
| 2,902,649 | 9/1959 | Bachmann | 329/137 |
| 3,404,346 | 10/1968 | Hall et al. | 329/145 |
| 3,881,157 | 4/1975 | McLaughlin | 329/145 |
| 3,904,968 | 9/1975 | Brinegar | 325/427 |

OTHER PUBLICATIONS

Microdyne Corporation, Satellite TV Receiver, Model 1100-TVR(VT), 2/1976.
Instruction Manual, Model 1100-TVR(VT), Satellite/TV Receiver, Microdyne Corp., Apr. 1976.
Microdyne Corporation, Satellite TV Receiver, Model 1100-TVR Jun. 1975 (Exhibit A).
Balanced Madulator-Demodulator MG1596 MC1496, specifications and applications information.
Double-Balanced Mixers, Mini-Circuits, pp. 5-10, 15-19.

*Primary Examiner*—Jin F. Ng
*Assistant Examiner*—Tommy P. Chin
*Attorney, Agent, or Firm*—William D. Hall

[57] ABSTRACT

This new demodulator for frequency modulated signals separates the signals into two distinct paths and delays the signals in one of the paths, with reference to those in the other of said paths, by an integral odd multiple of a quarter of one wavelength of the center wavelength of the signals. A particular type of balanced mixer compares the outputs of said two paths and produces an output varying in amplitude according to the phase difference between the signals at the outputs of said two paths.

The above improvement has peculiar advantages in FM receivers for the relatively weak, wide band (excess of 2MHz), frequency modulated, television signals received from satellites.

7 Claims, 3 Drawing Figures

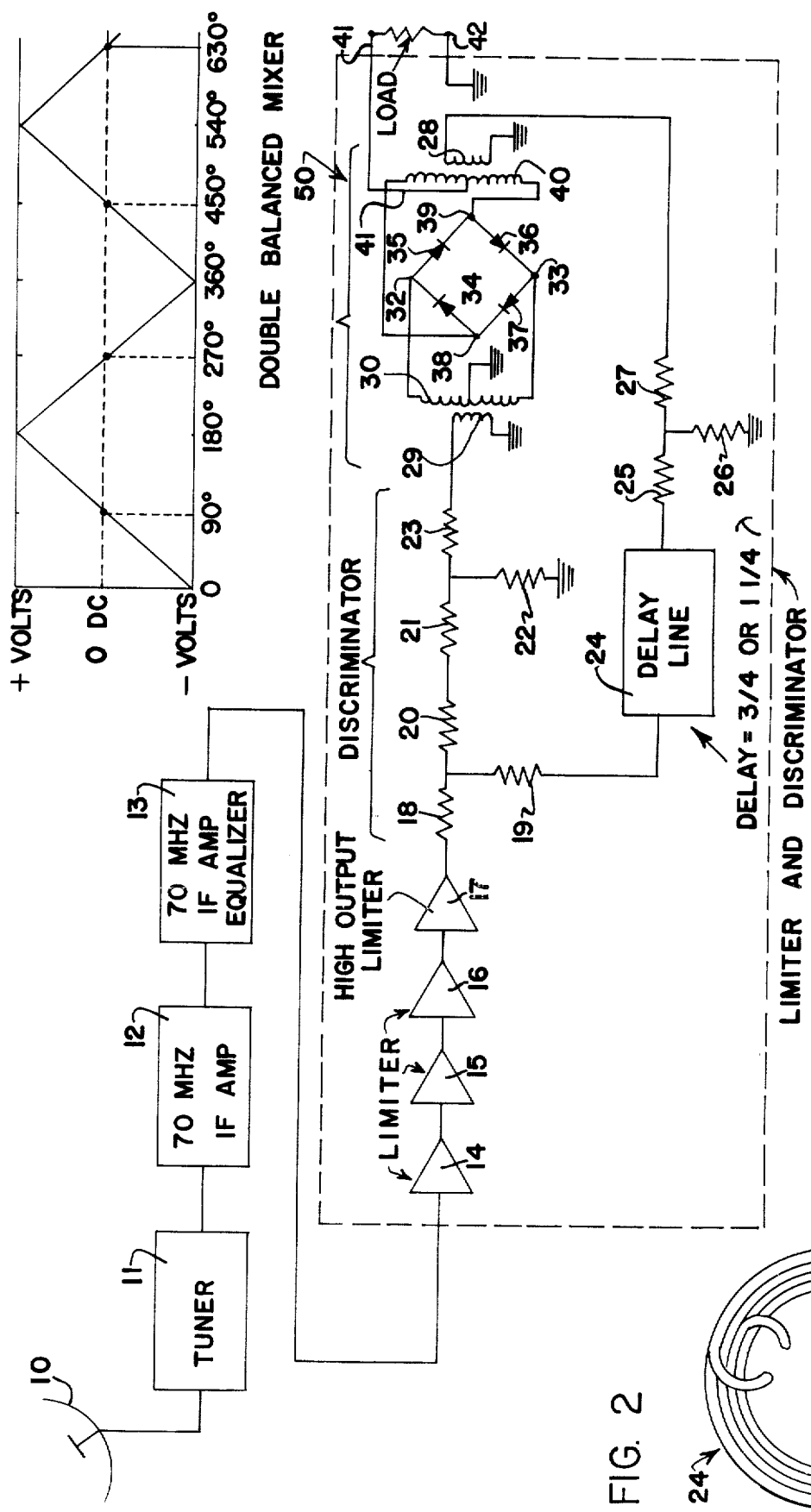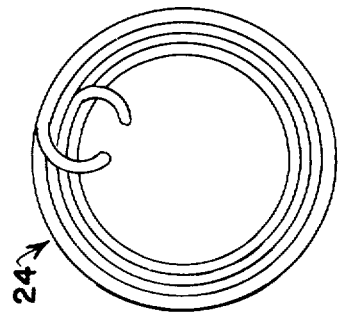

4,288,876

DEMODULATOR FOR FREQUENCY MODULATED SIGNALS

BACKGROUND OF THE INVENTION

There has been a continuous demand for an improved FM discriminator especially for wide band (excess of 2 MHz) frequency modulated signals. This is especially true in the case of FM receivers designed to receive the rather weak television signals from satellites. The discriminator in such a case must have excellent linearity, be low in cost, easily reproducable in quantity, and have maximum sensitivity. Preferably the bandwidth of the discriminator should be subject to change in a simple and effective way.

The prior art teaches that frequency modulated signals may be demodulated by splitting the received signals into two paths, delaying the signals in one of the paths by one-quarter wavelength, and employing a phase detector that compares the phase differences in the signals at the outputs of said paths, respectively, and produces a signal varying in amplitude in accordance with the variations in said phase differences.

The concept of delaying a signal by one-quarter wavelength and comparing its phase with that of a similar signal that was not subject to delay has been commonplace, in the art of FM deiscriminators, for many years.

SUMMARY OF THE INVENTION

A superhetrodyne FM receiver is fed by a directional antenna that receives weak FM television signals from a satellite.

In the demodulator for the FM receiver, the frequency modulated signal is split into two paths. A delay line in one path delays the signals in that path by an integral odd multiple of one-quarter wavelength, that is by $\frac{3}{4}$, 1.25, 1.75, 2.25, or 2.75, etc., wavelength. The signals at the outputs of the two paths are fed to a particular type of balance mixer which produces an output varying in amplitude in accordance with variations in the phase difference at the outputs of said two paths.

The demodulator does not include an amplifier.

The invention has peculiar advantages in connection with wide band (in excess of 2 MHz) frequency modulated television signals. An example of a very advantageous application of the invention is in connection with weak, frequency modulated, television signals received from a satellite.

BRIEF DESCRIPTION OF THE DRAWINGS

FIG. 1 is a diagram, which is partly a block diagram and partly a schematic drawing, of an FM receiver for receiving weak, frequency modulated, television signals from a satellite, and embodying the invention.

FIG. 2 is a front view of the preferred form of the delay line used in FIG. 1.

FIG. 3 illustrates the output of a double balanced mixer for phase differences between zero and 630 degrees.

DETAILED DESCRIPTION OF THE DRAWINGS

In FIG. 1 there is shown a receiver designed for receiving, adjacent the surface of the earth, frequency modulated television signals transmitted by a directional antenna on a satellite over twenty thousand miles away. The transmitter at the satellite may, for example, have low power such as 5 watts. The receiver has a directional antenna 10 beamed at the satellite. The center frequency of the frequency modulated signals may, for example, be on the order of 4 GHz. The antenna 10 feeds tuner 11 which produces an IF output at 70 MHz. That signal is fed through IF amplifiers 12 and 13 and limiters 14 to 17 inclusive. Limiter 17 is a high output limiter because a high level of signal strength is required for the demodulator. The limiters perform their usual function in an FM receiver, that is, they remove amplitude variations from the signal to thus eliminate unwanted noise. The output of limiter 17 is first split into two current paths, one of which includes resistors 20, 21 and 23, and the other of which paths includes delay line 24 and resistors 25 and 27. Resistors 18, 19 and 20 constitute a power splitter, that is, they cause the power received by resistor 18 to be split into two substantially equal signals for the above-named two paths, respectively. Thus, the signal strength of the signal at the output of resistor 23 is substantially equal to the signal strength at the output of resistor 27.

Resistors 21, 22 and 23 constitute an isolation network to isolate the input 29 of double balanced mixer 50 from the output of the power splitter 18, 19, 20. The signals passing through resistor 19 are fed to delay line 24 which delays the signals by an integral odd multiple of one-quarter of a wavelength. This definition excludes a delay of only one-quarter of a wavelength. Hence, the minimum permissible delay, according to the invention, is three-quarters of the center wavelength. Similarly, a delay of on and one-quarter times the center wavelength may be employed. Depending on the circumstances, longer delays, if they are integral odd multiples of a one-quarter wavelength, may be employed. The output of the delay line 24 is fed through isolation network 25, 26, 27 which feeds the input 28 of the double balanced mixer 50.

The double balanced mixer 50 has two transformers 28, 40 and 29, 30. The transformer 28, 40 has a primary 28 and a secondary 40. The primary 28 is fed by the output of resistor 27, and the secondary 40 feeds its output to points 38 and 39 of a bridge comprising four diodes 34, 35, 36 and 37. Similarly, the transformer 29, 30 has its primary 29 fed by the output of resistor 23. The output of its secondary 30 feeds points 32 and 33 of said bridge. The output 41 of the double balanced mixer 50 is obtained from the center tap of secondary 40. The other output of the double balanced mixer 50 is ground which is connected to the center tap of secondary 30 and constitutes output terminal 42. When variations in the phase differences, between the signals in primaries 28 and 29, occur, an output varying in amplitude appears upon wire 41, in accordance with well-known principles. The double balanced mixer described in this paragraph is not only well known in the prior art but has previously been used in FM receivers such as the one shown in FIG. 1, except that the delay line effected a delay of only one-quarter wavelength instead of the delays that are the crux of the present invention.

FIG. 2 illustrates a suitable delay line 24, for a discriminator operating at 70 MHz center frequency, in the form of a coaxial cable over 7 feet long and wound in a coil that is slightly less than two inches outside diameter.

FIG. 3 illustrates the output voltage at terminal 41 in relation to the phase difference between the signals on primaries 28 and 29. When that phase difference is 90 degrees, it is noted that the output voltage on terminal 41 is zero. As the phase difference departs from 90 degrees, toward 180 degrees, or toward zero degrees, a positive or negative voltage, as the case may be, will appear upon terminal 41. Thus, as was well known in the prior art, a signal varying in amplitude will appear at terminal 41 if the signal fed to primary 28 is delayed by one-quarter wavelength, behind the signal arriving at primary 29.

However, according to the invention, much better results may be obtained, especially where the deviation of the frequency modulated signals from the center frequency is above 2 MHz. In the typical case of a receiver of the character described, the deviation of the center frequency would be 10 MHz peak.

To illustrate the advantage of the invention, I will next compare the prior art arrangement wherein there is a delay of one-quarter wavelength, with our invention where the delay is, for example, three-quarters wavelength or alternatively, one and one-quarter wavelength. In all three examples, I will assume an IF center frequency of 70 MHz. The term "frequency of interest" will be used to refer to the instantaneous frequency at any given instant during the FM modulation. Bandwidth is abbreviated BW.

EXAMPLE I

Prior Art ¼ Wavelength Delay

If the maximum output of double balanced mixer 50 is ±300 mV for ±90° maximum phase shift (see FIG. 3), and if the output of the overdriven balanced mixer is essentially linear as shown in FIG. 3, the sensitivity becomes 3.34 mV/°.

The equation for delay in degrees of a ¼ wavelength delay line is:

$$\text{Delay } 0° = (\text{freq. of interest}) \cdot \left( \frac{1}{4} \times \frac{1}{\text{center freq.}} \right) (360°)$$

Setting the frequency of interest equal to the center frequency yields 360°/4 = 90° which provides zero volts DC out from the balanced mixer. Similarly, setting the frequency of interest ±10 MHz around the center frequency 70 MHz yields the following:

60 MHz = 77.14°
70 MHz = 90.0°
80 MHz = 102.86°

Thus, we have a delta difference at ±12.86° which yields an output of ±42.95 mV for 10 MHz peak deviation.

The discriminator bandwidth can be calculated by rearranging the delay equation and letting the end points equal ±90°, as follows:

BW = ±(90°/360°) (center frequency 70 MHz) (4)
BW = ±70 MHz.

Thus, the bandwidth of the ¼ wavelength discriminator is from DC to 140 MHz.

EXAMPLE II

¾ Wavelength Delay According To This Invention

Now, calculating for the odd multiple quadrature FM discriminator using ¾ wavelength delay:

$$\text{Delay } 0° = \text{freq. of interest} \cdot \frac{3}{4} \left( \frac{1}{\text{center freq.}} \right) 360°$$

¾ wavelength data:
60 MHz = 231.43°
70 MHz = 270.0°
80 MHz = 308.57°

Since the double balanced mixer 50 produces zero volts DC at 270°, we have a delta difference of ±38.57° which yields an output of ±128.82 mV for 10 MHz peak deviation.

Calculating the BW of the ¾ wavelength discriminator,

BW = ±(90°/360°) (center frequency 70 MHz) (4/3)
BW = ±23.34 MHz

EXAMPLE III

1¼ Wavelength Delay According to Invention

Similarly, calculating the 1¼ wavelength unit yields
60 MHz = 385.71°
70 MHz = 450.0°
80 MHz = 514.29°

The double balanced mixer produces zero volts DC at a center frequency with 450° delay (see FIG. 3). Solving for the data difference from 450° yields ±64.29° which produces an output of ±214.7 mV for 10 MHz peak deviation.

Calculating BW yields ±14 MHz for 10 MHz peak deviation.

COMPARISON OF EXAMPLES I, II AND III

Making a table for the three discriminators, we see the improvement of the ¾ wavelength and the 1¼ wavelength discriminator over the conventional ¼ wavelength delay line discriminator.

| | ¼ Wavelength Conventional | |
|---|---|---|
| Bandwidth ±70 MHz | Δ° for ±10 MHz change in freq. ±12.86° | Output ±42.95 mV |
| | ¾ Wavelength Delay Line | |
| Bandwidth ±23.34 MHz | Δ° for ±10 MHz change in freq. ±38.57° | Output ±128.82 mV |
| | 1¼ Wavelength Delay Line | |
| Bandwidth ±14.0 MHz | Δ° for ±10 MHz change in freq. ±64.29° | Output ±214.73 mV |

It follows that if a 1¼ wavelength delay line is used in place of a conventional ¼ wavelength unit, where there is a 70 MHz center frequency with 10 MHz peak deviation, there is an improvement of 5 to 1 in output sensitivity.

OTHER EXAMPLES

Several examples of the application of the invention have been given and these will doubtless enable those skilled in the art to apply the principle of the invention to such other applications where it may advantageously be employed.

FLEXIBILITY

The invention provides a high degree of flexibility for the discriminator. The bandwidth for the FM signals passing through the discriminator may be changed in a very simple manner such as by bodily substituting a ¾ wavelength delay line for a 1¼ wavelength delay line. Similarly, a delay line having various taps may be employed. This would permit a delay of any integral odd multiple of ¼ wavelength, to be selected. Such an arrangement would enable the bandwidth to be readily changed at will.

We claim to have invented:

1. A receiver for receiving frequency modulated television signals from a satellite comprising:

a directional antenna beamed at a satellite for receiving the frequency modulated waves, heterodyne means for producing intermediate frequency signals that are frequency modulated in accordance with the frequency modulations on the television signals received from the satellite, said heterodyne means having an output, limiter means in the output of the heterodyne means for limiting the amplitude of the signals in said output of said heterodyne means, said limiter means having an output, power splitter means having an input connected to the output of the limiter means for splitting the output of said limiter means into first and second outputs, a double balanced mixer having first and second inputs, first isolation and attenuator means connecting the first output of said power splitter to the first input of said double balanced mixer, a delay line having an input fed by the second output of said power splitter, said delay line having an output, second isolation and attenuator means having an input fed by the output of said delay line and having an output feeding the second input to said double balanced mixer for transmitting the output of said delay line to the second input of the double balanced mixer, said delay line and said second isolation and attenuator means having a combined delay, with reference to the delay of the first isolation means, which is at least three-quarters of the wavelength of the center frequency of said intermediate frequency signals and which is an integral odd multiple of said wavelength, said double balanced mixer comprising:

(a) first and second transformers each having a primary and a secondary, said primaries respectively comprising said first and second inputs to the double balanced mixer, (b) a bridge comprising four rectifiers connected together to form four junctions as follows: the first rectifier passing current from the first junction to the second junction, the second rectifier passing current from the second to the third junction, the third rectifier passing current from the third to the fourth junction, and the fourth rectifier passing current from the fourth junction to the first one, (c) means connecting the secondary of said first transformer across said first and third junctions, and (d) means connecting the secondary of said second transformer across said second and fourth junctions, (e) each of said secondaries having a center-tap, whereby modulated signals, including the intelligence embodied in the modulation on the signals received from the satellite, appear across said two center taps, and a load connected between said center-taps;

said heterodyne means and said limiter mea[ns in]cluding means for providing a sufficient lev[el of] power at said power splitter so that no addit[ional] amplification between the power splitter [and] said load is necessary; and said power spli[tter,] said first and second isolation and attenu[ator] means, said delay line, and said double balan[ced] mixer processing the signals passing th[rough] through without amplification.

2. A receiver for receiving frequency modul[ated] television signals from a satellite as defined in claim [1] which said power splitter has a junction and compr[ises] three resistors as follows:

(a) a resistor between the output of said limiter [and] said last-named junction, (b) a resistor between said last-named junction [and] said first isolation and attenuator means, and (c) a resistor between said last-named junction a[nd] the input to said delay line.

3. A receiver as defined in claim 1 in which said del[ay] line is three-quarters of said wavelength in length.

4. A receiver as defined in claim 1 in which said del[ay] line is one and one-quarter of said wavelength in leng[th.]

5. In a receiver for receiving frequency modulat[ed] signals from a satellite:

a directional antenna beamed at a satellite for recei[v]ing the frequency modulated signals, heterodyne means for producing intermediate fr[e]quency signals that are frequency modulated i[n] accordance with the frequency modulations on th[e] signals received from the satellite, limiter means fed by the heterodyne means for limit[ing] the amplitude of the intermediate frequenc[y] signals from said heterodyne means, said limite[r] means having an output, and a load, the improvement comprising:

a double balanced mixer having first and second inputs, and also having two outputs across said load, said double balanced mixer comprising:

(a) first and second transformers each having a primary and a secondary, said primaries respectively comprising said first and second inputs to the double balanced mixer, (b) a bridge comprising four rectifiers connected together to form four junctions as follows: the first rectifier passing current from the first junction to the second junction, the second rectifier passing current from the second to the third junction, the third rectifier passing current from the third to the fourth junction, and the fourth rectifier passing current from the fourth junction to the first one, (c) means connecting the secondary of said first transformer across said first and third junctions, and (d) means connecting the secondary of said second transformer across said second and fourth junctions, (e) each of said secondaries having a center-tap, whereby modulated signals, including the intelligence embodied in the modulation on the signals received from the satellite, appear across said two center taps, said two center taps comprising said two outputs that are across said load, first connecting means connecting said first-named output to the first input of said double balanced mixer, delay line having an input fed by said first named output, said delay line having an output, and second connecting means having an input fed by the output of said delay line and having an output feeding the second input of said double balanced mixer for transmitting the output of said delay line to the second input of the double balanced mixer, said delay line and said second connecting means having a combined delay, with reference to the delay of said first connecting means, which is at least three-quarters of the wavelength of the center frequency of said intermediate frequency signals and which is an integral odd multiple of said wavelength.

said heterodyne means and said limiter means including means for providing a sufficient level of power so that no additional amplification between the limiter means and said load is necessary; and each of (a) said first and second connecting means, (b) said delay line, and (c) said double balanced mixer, processing the signals passing therethrough without amplification.

6. A receiver as defined in claim 5 in which said delay line is three-quarters of said wavelength in length.

7. A receiver as defined in claim 5 in which said delay line is one and one-quarter of said wavelength in length.

* * * * *